(12) United States Patent
Fulford et al.

(10) Patent No.: US 12,276,922 B2
(45) Date of Patent: Apr. 15, 2025

(54) BACKSIDE DEPOSITION TUNING OF STRESS TO CONTROL WAFER BOW IN SEMICONDUCTOR PROCESSING

(71) Applicant: Tokyo Electron Limited, Tokyo (JP)

(72) Inventors: Daniel Fulford, Ballston Lake, NY (US); Anton J. Devilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 124 days.

(21) Appl. No.: 17/198,936

(22) Filed: Mar. 11, 2021

(65) Prior Publication Data

US 2021/0366792 A1    Nov. 25, 2021

Related U.S. Application Data

(60) Provisional application No. 63/028,905, filed on May 22, 2020.

(51) Int. Cl.
*G03F 7/00* (2006.01)
*G03F 7/09* (2006.01)
(Continued)

(52) U.S. Cl.
CPC .......... *G03F 7/70783* (2013.01); *G03F 7/092* (2013.01); *G03F 7/70483* (2013.01);
(Continued)

(58) Field of Classification Search
CPC .. G03F 7/70783; G03F 7/70483; G03F 7/092; H01L 21/02016; H01L 21/67288
See application file for complete search history.

(56) References Cited

U.S. PATENT DOCUMENTS 9,136,192 B2    9/2015    Inoue et al.
9,230,868 B2    1/2016    Inoue et al.
(Continued)

FOREIGN PATENT DOCUMENTS

JP           6149728 B2    6/2017
KR    10-2009-0084171 A    8/2009
TW         201041029 A    11/2010

OTHER PUBLICATIONS

International Search Report and Written Opinion issued Jul. 12, 2021 in PCT/US2021/022469, 10 pages.
(Continued)

*Primary Examiner* — Dale E Page
*Assistant Examiner* — Abbigale A Boyle
(74) *Attorney, Agent, or Firm* — Oblon, McClelland, Maier & Neustadt, L.L.P.

(57) ABSTRACT

A method of microfabrication is provided. A substrate having a working surface and having a backside surface opposite to the working surface is received. The substrate has an initial wafer bow resulting from one or more micro fabrication processing steps executed on the working surface of the substrate. The initial wafer bow of the substrate is measured and the initial wafer bow is used to generate an initial wafer bow value that identifies a degree of first order wafer bowing of the substrate. A correction film recipe based on the initial wafer bow value is identified. The correction film recipe specifies parameters of a correction film to be deposited on the backside surface of the substrate to change wafer bow of the substrate from the initial wafer bow to a modified wafer bow. The correction film on the backside surface of the substrate according to the correction film recipe is deposited. The correction film physically modifies internal stresses on the substrate and causes the substrate to (Continued)

have a modified bow with the predetermined wafer bow value.

20 Claims, 5 Drawing Sheets

(51) Int. Cl.
*H01L 21/02* (2006.01)
*H01L 21/66* (2006.01)
*H01L 21/67* (2006.01)
*H01L 23/00* (2006.01)

(52) U.S. Cl.
CPC .. *H01L 21/02016* (2013.01); *H01L 21/67253* (2013.01); *H01L 21/67288* (2013.01); *H01L 22/26* (2013.01); *H01L 23/562* (2013.01)

(56) References Cited

U.S. PATENT DOCUMENTS

| | | | |
|---|---|---|---|
| 9,406,536 | B1 | 8/2016 | Kobayashi et al. |
| 9,613,875 | B2 | 4/2017 | Kobayashi et al. |
| 10,157,747 | B2 | 12/2018 | deVilliers |
| 10,347,591 | B2 | 7/2019 | Bellotti et al. |
| 10,431,468 | B2 | 10/2019 | deVilliers et al. |
| 10,453,692 | B2 | 10/2019 | deVilliers et al. |
| 10,475,657 | B2 | 11/2019 | deVilliers |
| 10,622,233 | B2 | 4/2020 | Hooge et al. |
| 10,811,265 | B2 | 10/2020 | deVilliers |
| 2014/0116986 | A1* | 5/2014 | Akasaka ............... G02B 3/0075 216/26 |
| 2014/0287538 | A1 | 9/2014 | Inoue et al. |
| 2015/0332978 | A1 | 11/2015 | Inoue et al. |
| 2015/0340225 | A1 | 11/2015 | Kim et al. |
| 2016/0379904 | A1 | 12/2016 | Kobayashi et al. |
| 2017/0162522 | A1* | 6/2017 | Chang ............... H01L 21/02183 |
| 2018/0067403 | A1 | 3/2018 | deVilliers |
| 2018/0068859 | A1 | 3/2018 | deVilliers et al. |
| 2018/0068860 | A1 | 3/2018 | deVilliers et al. |
| 2018/0068861 | A1* | 3/2018 | deVilliers ........... H01L 21/6875 |
| 2018/0082960 | A1 | 3/2018 | Bellotti et al. |
| 2018/0108588 | A1* | 4/2018 | Aoike ................. H01L 21/0217 |
| 2018/0342410 | A1 | 11/2018 | Hooge et al. |
| 2020/0058509 | A1 | 2/2020 | deVilliers |
| 2020/0105531 | A1* | 4/2020 | Liu ..................... C23C 14/0617 |
| 2020/0118822 | A1* | 4/2020 | Falk .................... H01L 21/302 |
| 2020/0201027 | A1* | 6/2020 | Zhou ................... G01S 17/931 |

OTHER PUBLICATIONS

Office Action issued Oct. 29, 2024, in corresponding Taiwanese Patent Application No. 110117987, with English translation, 19 pages.

Taiwanese Office Action and Search Report mailed on Jul. 30, 2024, issued in Taiwanese Patent Application No. 110117987, with English Translation, total 16 pages.

* cited by examiner

BACKSIDE DEPOSITION TUNING OF STRESS TO CONTROL WAFER BOW IN SEMICONDUCTOR PROCESSING

INCORPORATION BY REFERENCE

This present disclosure claims the benefit of U.S. Provisional Application No. 63/028,905, filed on May 22, 2020, the entire content of which is incorporated herein by reference in its entirety.

FIELD OF THE INVENTION

This disclosure relates to semiconductor fabrication, and particularly to overall wafer shape.

BACKGROUND

Semiconductor fabrication involves multiple varied steps and processes. One typical fabrication process is known as photolithography (also called microlithography). Photolithography uses radiation, such as ultraviolet or visible light, to generate fine patterns in a semiconductor device design. Many types of semiconductor devices, such as diodes, transistors, and integrated circuits, can be constructed using semiconductor fabrication techniques including photolithography, etching, film deposition, surface cleaning, metallization, and so forth.

Exposure systems (also called tools) are used to implement photolithographic techniques. An exposure system typically includes an illumination system, a reticle (also called a photomask) or spatial light modulator (SLM) for creating a circuit pattern, a projection system, and a wafer alignment stage for aligning a photosensitive resist-covered semiconductor wafer. The illumination system illuminates a region of the reticle or SLM with a (preferably) rectangular slot illumination field. The projection system projects an image of the illuminated region of the reticle pattern onto the wafer. For accurate projection, it is important to expose a pattern of light on a wafer that is relatively flat or planar, preferably having less than 10 microns of height deviation.

SUMMARY

The present disclosure relates to semiconductor fabrication, and particularly to overall wafer shape.

A first aspect is a system for modifying wafer bow. The system can include a metrology module configured to measure wafer bow of a substrate and generate an initial wafer bow value that identifies a degree of first order wafer bowing of the substrate, a controller configured to receive the initial wafer bow value and identify a correction film recipe to change wafer bow of the substrate from the initial wafer bow to a modified wafer bow, and a backside deposition module having a substrate holder and substrate treatment components configured to deposit the correction film on the backside surface of the substrate according to the correction film recipe.

In some embodiments, the substrate can have a working surface and has a backside surface opposite to the working surface.

In some embodiments, the initial wafer bow of the substrate can result from one or more micro fabrication processing steps executed on the working surface of the substrate.

In some embodiments, the correction film recipe can identify a thickness of material to be deposited on the backside surface of the substrate.

In some embodiments, the correction film recipe can identify a type of material to be deposited on the backside surface of the substrate.

In some embodiments, the correction film recipe can identify a deposition temperature of material to be deposited on the backside surface of the substrate In some embodiments, the correction film recipe can specify parameters of the correction film to be deposited on the backside surface of the substrate.

In some embodiments, the correction film recipe can identify a stack of at least two films to be deposited.

In some embodiments, the modified wafer bow can have a predetermined wafer bow value.

In some embodiments, the correction film can physically modify internal stresses on the substrate and causes the substrate to have the modified wafer bow with the predetermined wafer bow value.

In some embodiments, the initial wafer bow value can represent a substrate having a convex shape of the working surface, and wherein a modified wafer bow value of the modified wafer bow represents a concave shape of the working surface.

In some embodiments, the correction film recipe can identify a number of atomic layer deposition cycles to execute using the backside deposition module.

A second aspect is a method for modifying wafer bow. The method can include receiving a substrate having a working surface and having a backside surface opposite to the working surface. The initial wafer bow of the substrate can be measured to generate an initial wafer bow value that identifies a degree of first order wafer bowing of the substrate. A correction film recipe based on the initial wafer bow value can be identified. The correction film on the backside surface of the substrate can be deposited according to the correction film recipe.

In some embodiments, the substrate having an initial wafer bow can result from one or more micro fabrication processing steps executed on the working surface of the substrate.

In some embodiments, the correction film can physically modify internal stresses on the substrate and causing the substrate to have a modified bow with the predetermined wafer bow value.

In some embodiments, the correction film recipe can specify parameters of a correction film to be deposited on the backside surface of the substrate to change wafer bow of the substrate from the initial wafer bow to a modified wafer bow.

In some embodiments, steps of measuring wafer bow and depositing the correction film on the backside surface of the substrate can be executed within modules on a common platform.

In some embodiments, the initial wafer bow value can represent a substrate having a convex shape of the working surface, and wherein the modified wafer bow value represents a concave shape of the working surface.

In some embodiments, the correction film recipe can identify a thickness of material to be deposited on the backside surface of the wafer.

In some embodiments, the correction film recipe can identify a type of material to be deposited on the backside surface of the wafer.

In some embodiments, the correction film recipe can identify a deposition temperature of material to be deposited on the backside surface of the wafer.

In some embodiments, the correction film recipe can identify a stack of at least two films to be deposited.

In some embodiments, the modified wafer bow can have a predetermined wafer bow value.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

Figure 1A:
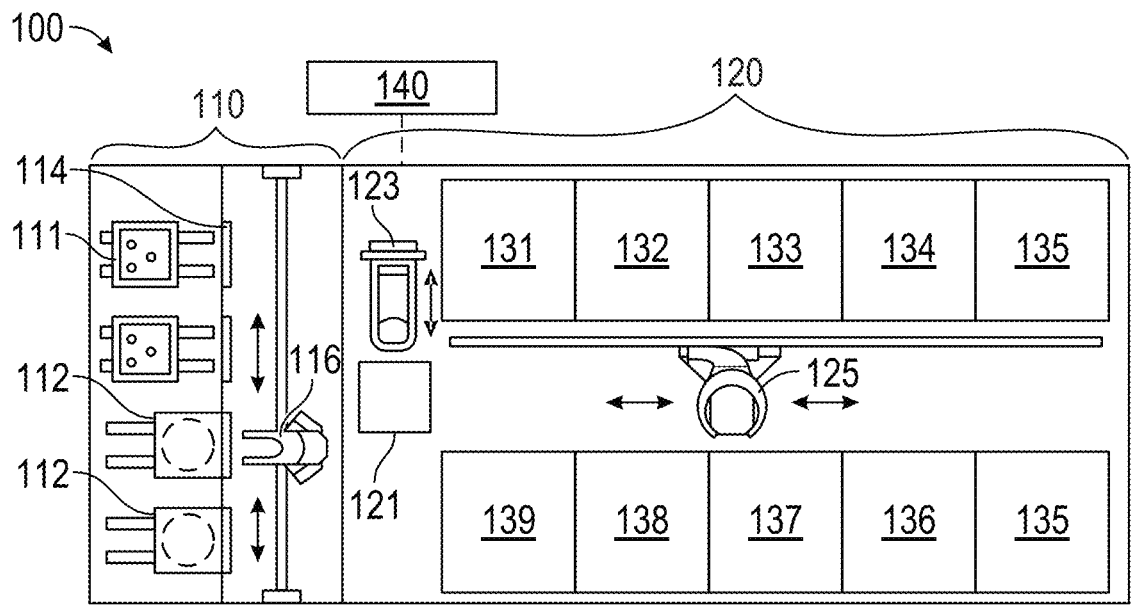
FIG. 1A shows a plan view of an example system for correcting wafer bow, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Semiconductor fabrication development now incorporates techniques such as advanced patterning and 3D device construction to reduce feature size and increase device density. The implementation of these techniques, however, has created new challenges for successful micro fabrication. These new fabrication approaches include the creation of multiple layers of film of various materials, on the wafer surface. Each layer, however, adds additional stress to the surface of the wafer. As the layers of film build up, the induced stress distorts the flatness of the wafer. This distortion has been shown to reduce the size uniformity of critical features across the surface of the wafer.

This distortion also results in overlay errors and challenges. Various fabrication process steps can cause expansion and/or contraction of the substrate, resulting is a warped or bowed substrate. For example, during exposure a substrate is heated locally due to the energy transferred to the substrate from an exposure beam. Substrates are also heated during anneal processes. This heating causes the substrate to expand. If the substrate expansion is unchecked, the expansion exceeds overlay error requirements. Moreover, if the clamping force between the substrate and the substrate chuck is insufficient to prevent substrate expansion, then the substrate can slip on the substrate chuck and larger substrate expansion will occur, resulting in larger overlay errors. Slipping can be more pronounced in some processes, such as in extreme ultraviolet (EUV) systems, because the environment surrounding the substrate during exposure is a vacuum. Thus, vacuum clamping is not always possible, and the weaker electrostatic clamping must be used in lieu of a vacuum clamp.

Other fabrication steps can also cause substrate expansion and contraction. For example, deposited films can cause substrate contraction. Also, various annealing and doping steps can create substantial amounts of bow in a given substrate. Annealing steps can especially create overlay challenges. The result of these various fabrication steps is a substrate that is uneven or non-planar. For example, a backside of the substrate can have z-height differences (differences in vertical heights) that have both high spots and low spots. Height differences due to such bowing can be on the order of about a micron to approximately 100 microns. This fluctuation is significant because semiconductor devices or structures being exposed by various exposure tools are being exposed on scales of tens of nanometers to hundreds of nanometers. Thus having deflection variations of thousands of nanometers to 10,000 nanometers can dramatically reduce yield.

Conventional techniques used to address substrate bow and uneven curvature on partially-processed substrates focus on chucking techniques to chuck (or clamp/suck) a substrate to a substrate holder to flatten curvature. With relatively significant bowing, however, it can be very difficult or impossible to accurately flatten a substrate by chucking alone. Thus, it is desirable to have a substrate bow correction technique to correct substrate bow and improve overlay prior to being sent or returned to a scanner for additional exposures.

In an embodiment, systems for measuring wafer bow and depositing films on a backside of a substrate tailored to create corrective or compensating stresses to counter stresses on a working surface of a wafer to flatten the wafer or reverse a curvature of a wafer are presented. In other words, applying films of a predetermined thickness to the back side of the wafer based on measured wafer bow can balance stressed surfaces on a front side of the wafer, to flatten a wafer bow and/or reverse a wafer bow to result is a wafer with a slight concavity.

In an embodiment, a system in which a metrology module and a backside deposition module are included in a common platform is presented. The metrology module is configured to measure wafer bow. This can include overall or global bow, that is, a first order bow or curvature. This can include measuring relatively z-heights of the wafer surface at coordinate location. After identifying a degree of wafer bow, this wafer bow measurement or signature is used to control a thickness of film deposited on a backside surface of the wafer. Wafer thickness and/or wafer deposition parameters can be based on a wafer bow measurement to change or correct. This can include a particular deposition temperature, pressure, dopant amount, et cetera.

Depositing films on the backside of a substrate is challenging. While many different semiconductor manufacturing tools deposit films on the front side (top side or working surface) of a substrate, backside deposition is not routinely performed. With front side deposition, a substrate usually sits on a chuck, susceptor or plate and may be clamped to that surface. Such chucking causes scratches and defects to the backside surface. The scratches and defects introduced to the backside of the substrate as a result are generally inconsequential since features and devices (transistors) are not present on the backside surface. To use existing deposition tools to deposit a film on the backside of a substrate, the substrate would have to be flipped upside down and placed on the supporting surface for processing. Chucking the substrate on the front side surface will cause scratches, introduce defects, and generally destroy features under fabrication. Accordingly, for successful device fabrication, the substrate cannot be placed on, clamped to, or contact a chuck with the front side surface.

In some embodiments, substrates are chucked to a substrate holder. However, when a starting wafer has a working surface that is convex, chucking becomes problematic. With edges contacting the substrate holder first, this creates a friction that prevents the wafer from spreading out properly and can cause distortions and overlay error. In contrast, when a wafer has a working surface with a small about of concavity so that the center of the wafer touches the substrate holder with upturned edges, the wafer can be smoothly chucked. Accordingly, it can be desirable to have a relatively small amount of distance between the edges of the wafer and the substrate holder prior to chucking. This concavity amount or distance can be in the tens or hundreds of microns depending on a particular application. Some embodiments can produce a concavity of +/−300 um.

Backside deposition can be executed using various systems including systems described in U.S. patent application Ser. No. 16/047,711, titled "System and Method for Backside Deposition of a Substrate," and filed on Jul. 27, 2018, which is hereby incorporated by reference in its entirety.

Such techniques can include backside processing. Typically, wafers have a working surface and a backside surface. The working surface is the surface on which semiconductor devices are fabricated, such as transistors, diodes, gates, wiring, et cetera. The backside surface is typically opposite to the working surface and is the surface that is typically clamped or chucked to substrate holders. Techniques herein include backside surface deposition of films to modify or tune internal stresses and change a wafer bow or first order curvature.

Figure 1B:
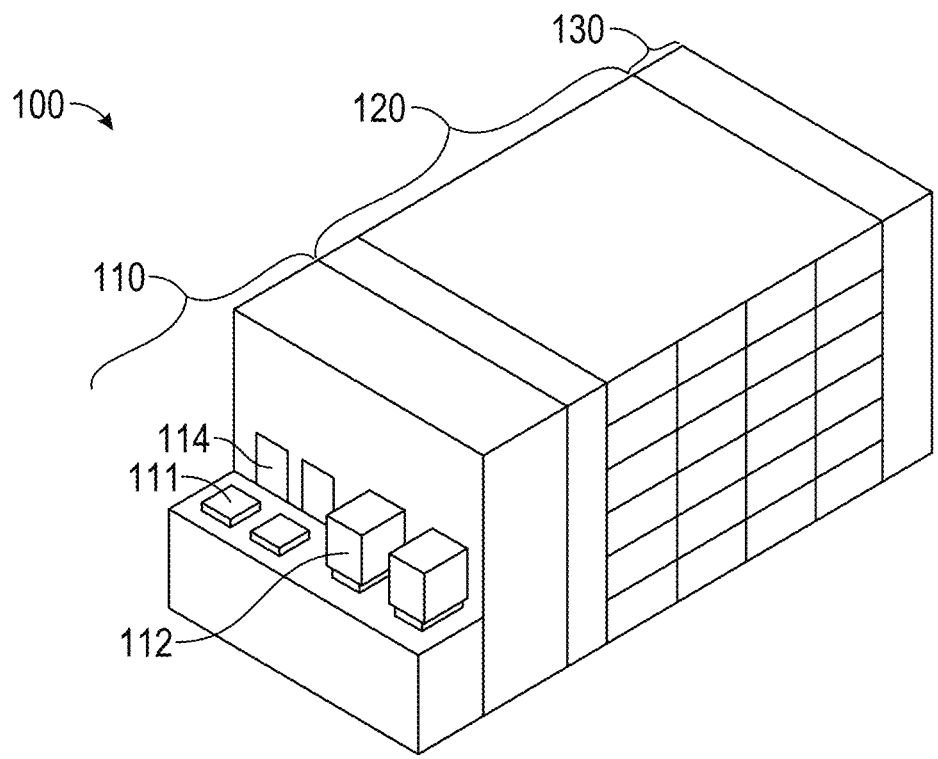
FIG. 1B shows an oblique view of the example system for correcting wafer bow, in accordance with embodiments of the disclosure.

FIG. 1A is a plan view of an example system for correcting wafer bow and FIG. 1B is an oblique view of the example system for correcting wafer bow. The system 100 includes various wafer handling components or carriers, along with several modules. Carrier block 110 includes stages 111 for receiving wafer carriers 112. Wafer carriers 112 can house several semiconductor wafers. Door 114 can open to access the several substrates in the wafer carriers. Transfer arm 116 can transfer substrates from wafer carriers 112 to shelf unit 121 in treatment block 120. Transfer arm 123 can be positioned adjacent to shelf unit 121 and capable of moving back and forth as well as vertically. Transfer arm 125 can then access substrates from shelf unit 121 or transfer arm 123 to move among the modules 131-139.

The system 100 can also include the modules 131-139 depending on a desired embodiment. Modules can include one or more metrology modules configured to measure an amount of bow of wafers. Modules can also include one or more backside deposition modules configured to deposit one or more films on a backside of a wafer being processed. Metrology modules can provide bow measurements to the system 100. Bow measurements can include measuring a degree of convexity or concavity, or map z-height deviations on the substrate relative to one or more reference z-height values. In other words, z-height deviations are spatially mapped, such as with coordinate locations, to identify z-height deviations across a surface of the substrate. Bow and z-height deviations can be mapped at various resolutions depending on types of metrology equipment used and/or a resolution desired.

The deposition module can be configured to hold the substrate with the working surface facing upwardly (away from the earth's gravitational pull) while depositing one or more films on the backside surface of the substrate. The metrology module and the backside deposition module can be on a common platform having an automated substrate handling system that automatically moves the substrate from the metrology module to the backside deposition module.

The backside deposition module uses chemical vapor deposition, atomic layer deposition, or other deposition techniques. Because chemical vapor deposition can be dependent on surface temperature, more or less material can be deposited based on a chamber temperature. Accordingly, a given correction film can indicate type of material, deposition temperature, and final thickness.

Processing can be executed in one or more modules depending on a type of treatment to the substrate to modify wafer bow. If the correction film indicates alternating layers of different materials, then a given wafer can be moved between or among modules to receive various incremental films. Accordingly, several modules can optionally be used.

The bow measurement can include raw bow data, or be represented as a bow signature with relative values. Note that in many embodiments, the reference z-height values may be all close to zero and thus representative of a wafer that is close to being flat. For example, a wafer that is close to being flat or considered flat for overlay improvement herein can be a wafer having an average deviation of less than 10 microns.

In some embodiments, the reference z-height values can represent some non-planar shape, but which shape is, notwithstanding, useful for overlay error correction—especially for particular stages of micro fabrication. Techniques herein enable correction of bowing that is greater than 10 microns. The metrology module is configured to measure a substrate having a working surface and having a backside surface opposite to the working surface. The substrate has an initial wafer bow value resulting from one or more micro fabrication processing steps that have been executed to create at least part of a semiconductor device on the working surface of the substrate. For example, field-effect transistors may be completed or only partially completed.

In the embodiment, a controller 140 in FIG. 1A is connected to system 100. The controller 140 can be a computer processor located within system 100, or located remotely but in communication with components of the system 100. The controller 140 is configured to receive a bow measurement or bow value and calculate or identify a correction film that when deposited on the backside surface results in a modified wafer bow value. The bow measurement can be received from the metrology module, e.g., 131, or from a separate system. The correction film identified can include types of material for the film, film thickness, deposition temperature, film combinations, dopants, et cetera.

The correction film can also be based on device parameters of the working surface of the substrate in addition to the bow measurement. For example, a relatively deep memory array can require more stress modification as compared to early stages of constructing a finFET device for logic. The correction film can be identified based on experimental tables, observed results, modeling, or other calculation methods. For example, if a wafer has a bow of 200 nm, then a particular thickness of silicon oxide or silicon nitride can be deposited. If the bow is 600 nm, then a different thickness or material can be deposited. Correction films can be deposited in different thicknesses and different temperatures on new wafers to observe induced stress for bow correction. Note that some films of a same material and same thickness can have different internal stresses based on deposition temperatures or added dopants or particles.

The system can include one or more processing modules having a substrate holder and substrate treatment components configured to physically modify internal stresses on the substrate by depositing one or more correction films on a backside surface of a wafer to modify wafer bow.

The system 100 can also include backside deposition module, e.g., 132. The backside deposition module, e.g., 132, can be configured to deposit one or more films on the backside surface of the substrate.

Figure 2:
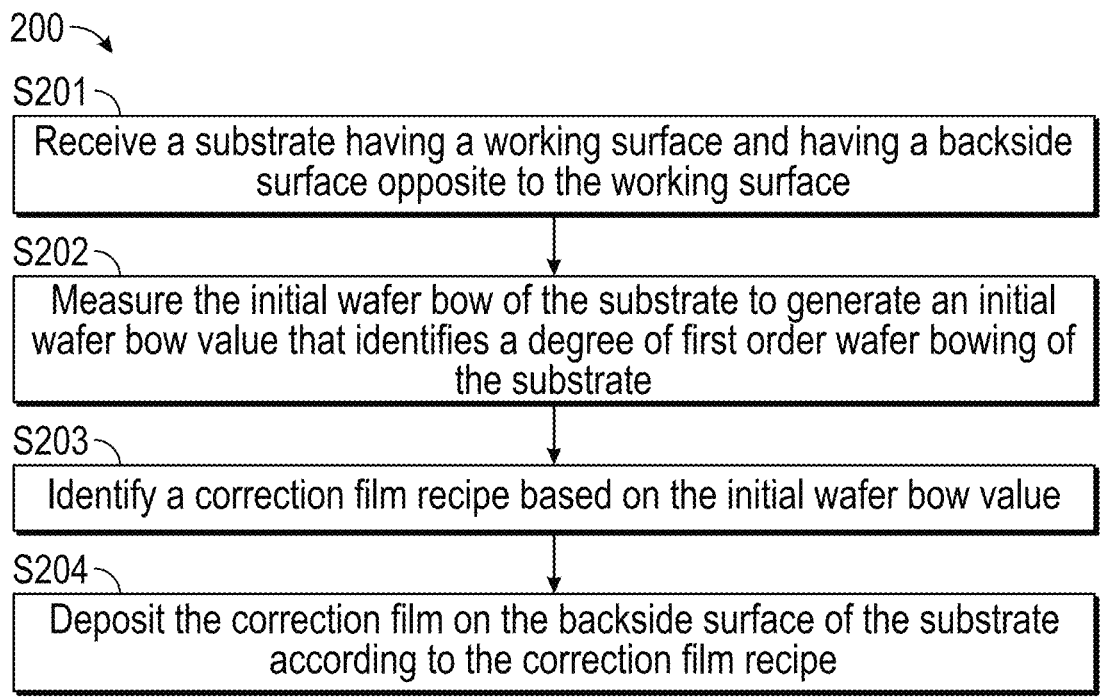
FIG. 2 shows a flow chart of an exemplary process for manufacturing an exemplary semiconductor device, in accordance with exemplary embodiments of the disclosure.

FIG. 2 shows a flow chart of an exemplary process 200 for manufacturing an exemplary semiconductor device, such as the system 100 and the like, in accordance with embodiments of the disclosure. The process 200 begins with step S201 where a substrate is received and the substrate is having a working surface and having a backside surface opposite to the working surface. The substrate having an initial wafer bow results from one or more micro fabrication processing steps executed on the working surface of the substrate.

At step S202, the initial wafer bow of the substrate is measured and the initial wafer bow is used to generate an initial wafer bow value that identifies a degree of first order wafer bowing of the substrate.

At step S203, a correction film recipe based on the initial wafer bow value is identified. The correction film recipe specifies parameters of a correction film to be deposited on the backside surface of the substrate to change wafer bow of the substrate from the initial wafer bow to a modified wafer bow.

At step S204, the correction film on the backside surface of the substrate is deposited according to the correction film recipe. The correction film physically modifies internal stresses on the substrate and causes the substrate to have a modified bow with the predetermined wafer bow value.

It should be noted that additional steps can be provided before, during, and after the process 200, and some of the steps described can be replaced, eliminated, or performed in a different order for additional embodiments of the process 200.

Figure 3:
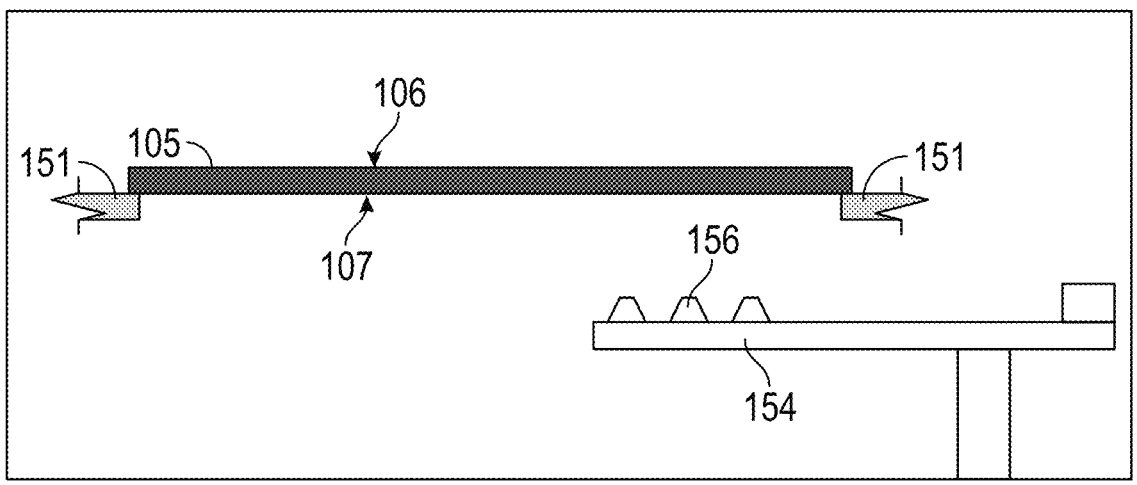
FIG. 3 shows a cross-sectional schematic view of a module for substrate measurement or inspection, in accordance with exemplary embodiments of the disclosure.

FIG. 3 is a cross-sectional schematic view of a module for substrate measurement or inspection, such as for use as metrology module, e.g., 131. A substrate 105 is held with perimeter support 151. The substrate 105 includes working surface 106 and backside surface 107. Note that either the working surface or the backside surface can be measured.

In this illustration, the backside surface 107 is set for measurement. Measurement arm 154 can include sensors 156 to measure z-height deviations across the backside surface. There are several mechanisms available to measure z-height deviation including optical, acoustic, and others. The substrate 105 can be stationary while measurement arm 154 is moved. Alternatively, substrate 105 can be rotating. Measurement arm 154 can have sensors 156 in contact with the backside surface 107 depending on a type of measurement mechanism selected.

Figure 4:
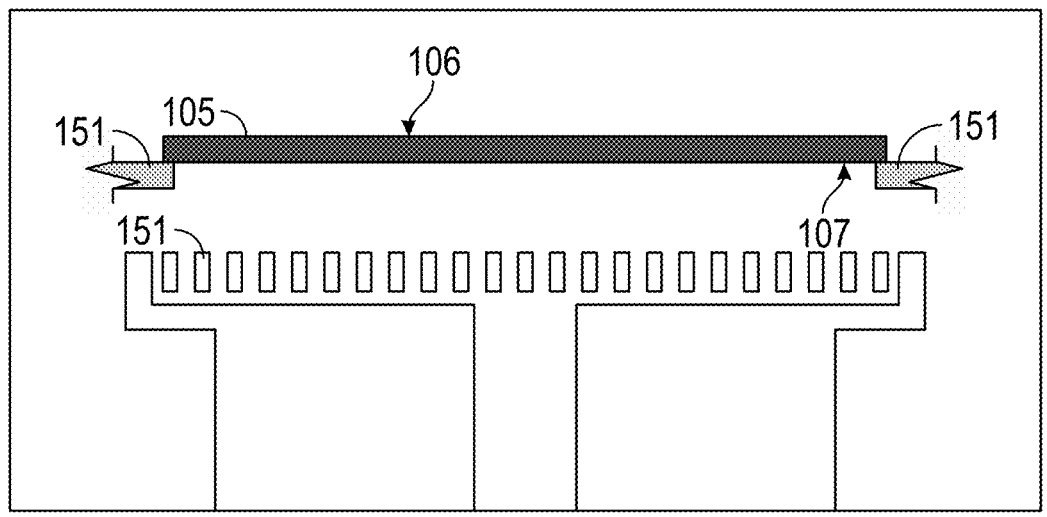
FIG. 4 shows a cross-sectional schematic view of a module for backside deposition, in accordance with exemplary embodiments of the disclosure.

FIG. 4 is a cross-sectional schematic view of a module for backside deposition, such as module 132. Backside deposition module, e.g., 132, can be configured to deposit two or more films of opposing stresses. Alternatively, separate deposition modules are used for each film of opposing stress or same stress. Backside deposition module, e.g., 132, can be configured to hold substrate 105 at a perimeter with backside surface facing upwardly, or downwardly. The backside surface can face upwardly for flowable or spin-on materials. In some embodiments, deposition can be executed on the backside surface while held with the working surface facing upwards.

The controller 140 in FIG. 1A is configured to generate a correction film description that identifies deposition parameters to execute to change the wafer bow from an initial wafer bow to a modified wafer bow. This can include receiving a wafer with a significant convexity relative to the working surface, and this can also include changing the bow so that the wafer has a slight concavity for better chucking for subsequent processing. The correction film description or specification identifies correction film deposition parameters to result in the modified wafer bow.

An automated substrate handling system is configured to transport substrates among the various modules. One or more of the modules can all be on the same or common platform. The automated substrate handling system can be configured to rotate or flip the substrate as needed by the various modules, though a given substrate can have a backside processing performed throughout this bow modification process while the working surface of the substrate remains facing upwardly. For embodiments that flip a substrate so that the working surface is facing downwardly and held by a conventional substrate holder or chuck, techniques can include adding a protection film to the working surface to protect the working surface (and devices thereon).

Figure 5:
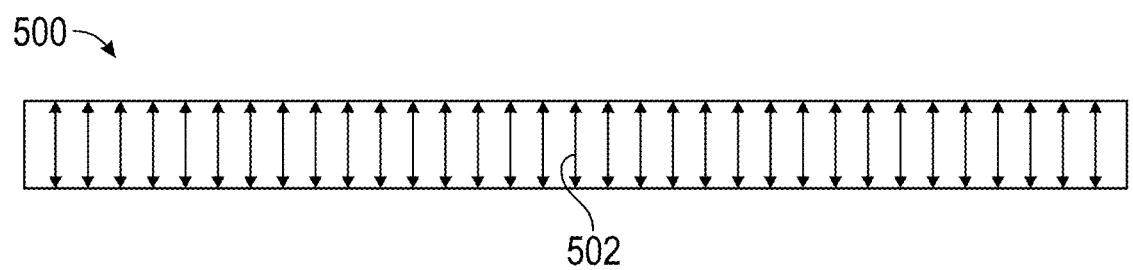
FIG. 5 shows a semiconductor wafer in a microfabrication process begins with a flat wafer, in accordance with exemplary embodiments of the disclosure.

FIG. 5 illustrates that a semiconductor wafer 500 in a microfabrication process begins with a flat wafer. During the microfabrication process of the semiconductor wafer 500, multiple processing steps are executed that can include depositing material on the substrate, removing material, implanting dopants, annealing, baking, and so forth. The different materials and structural formations can cause internal stresses 502 as shown in the substrate 500 which result in bowing of the wafer, which in turn affects overlay and typically results in overlay errors of various magnitude.

Figure 6:
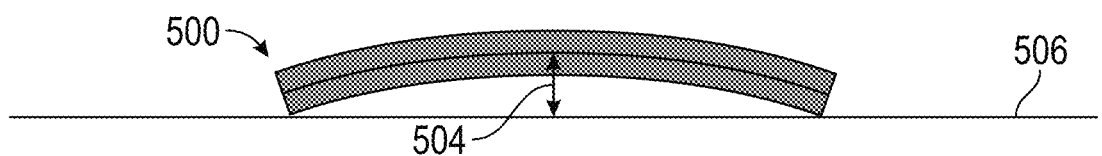
FIG. 6 shows first order bowing with measurement illustrating z-height deviation from a reference plane, in accordance with exemplary embodiments of the disclosure.

FIG. 6 illustrates first order bowing with measurement illustrating z-height deviation 504 from a reference plane 506. The first order bowing represents the z-height deviation of a highest and a lowest measured point on a wafer bowing. Because conventional processing to create circuits is one-sided (fabrication on the working surface), the bowing can quickly develop. Stresses of equal and opposite magnitude can cancel each other out. Accordingly, one technique is to fabricate identical structures on the backside surface of the substrate as are being fabricated for the working surface (either functioning or dummy structures). Such dual-sided microfabrication, however, can be challenging because it is desirable to avoid placing the working surface on a substrate holder or chuck as this can destroy fragile structures prior to metallization or packaging. Thus, simply flipping a wafer over for fabrication of a mitigation pattern on the backside is not preferred.

Figure 7:
FIG. 7 shows a flat wafer, in accordance with exemplary embodiments of the disclosure.
Figure 8:
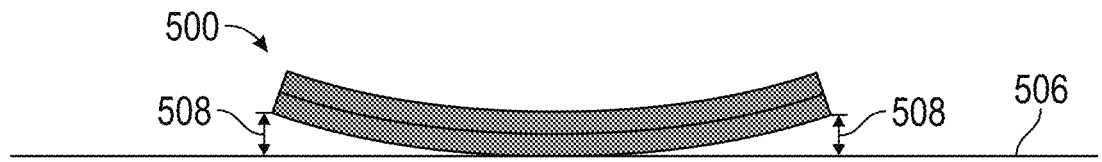
FIG. 8 shows a wafer with a relatively small concavity, in accordance with exemplary embodiments of the disclosure.

FIG. 7 illustrates a flat wafer and FIG. 8 illustrates a wafer with a relatively small concavity. In the embodiment, the wafer bow correction system receives an input of a substrate with some amount of bow. The system measures the substrate to identify a value of wafer bow, then a film characteristic is identified that will cause the wafer to have a modified bow after deposition of a corresponding film. Depositing the corresponding film according to the film characteristic then results in the wafer having a modified bow. The modified bow can result in the flat wafer, as illustrated in FIG. 7, or a wafer with a relatively small concavity, as illustrated in FIG. 8. Conventional processing of wafer often results in a wafer bow that is convex. In other words, when resting on a substrate holder, the edges of the wafer are in contact with the substrate holder or surface, while a center of the wafer is elevated above the substrate holder surface, as shown in FIG. 6.

Figure 9:
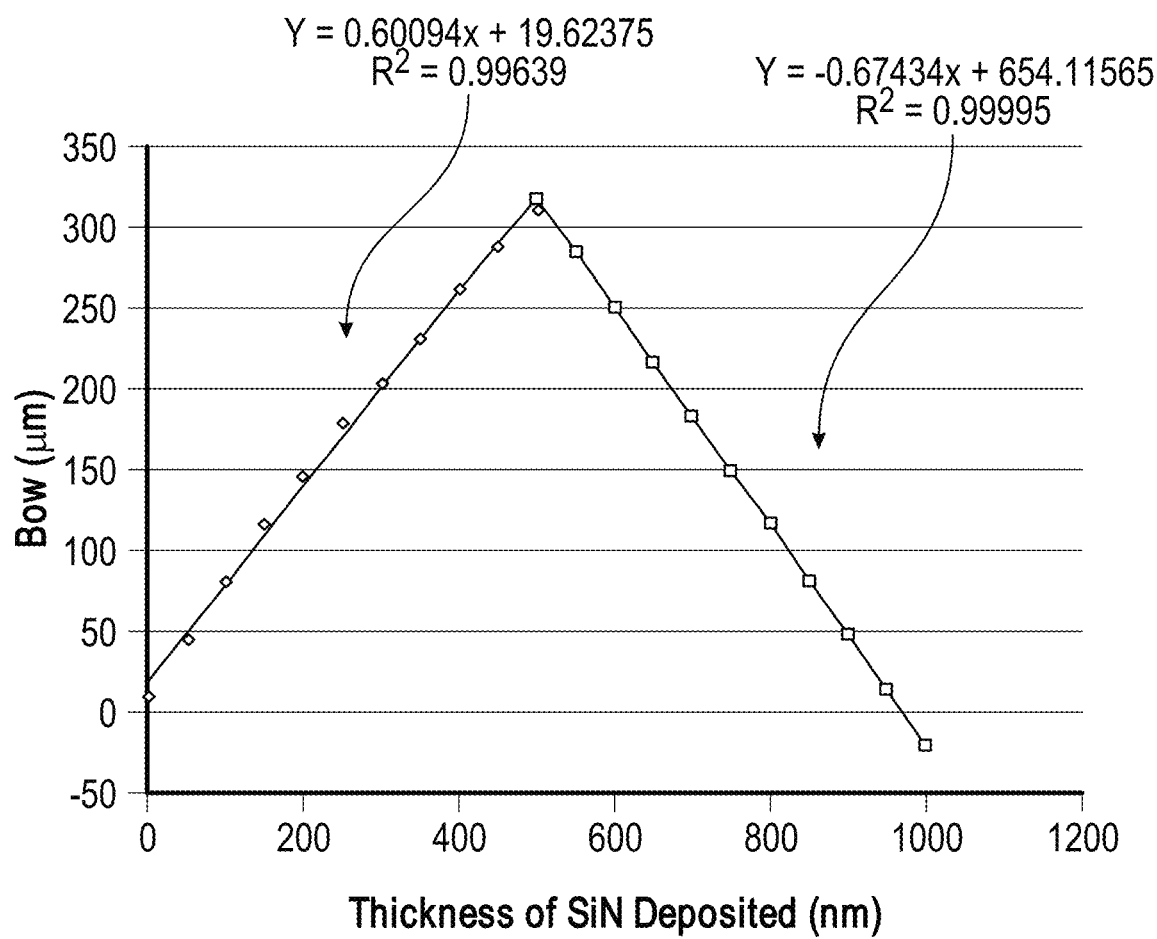
FIG. 9 shows a graph of tensile silicon nitride being added to a substrate which includes backside processing techniques that add films, in accordance with exemplary embodiments of the disclosure.

FIG. 9 illustrates a graph of tensile silicon nitride being added to a substrate which includes backside processing techniques that add films. Adding films can increase stresses and adjust global wafer bow, that is, first order deviations. Added layers or films can selectively add tensile or compressive stress to a substrate. For example, if a thickness of deposited SiN increases, a positive bowing (z-height deviation) on the substrate increases accordingly. If the thickness of the SiN is reduced, the positive bowing deviation is also reduced. A similar but mirrored result happens when depositing films with a compressive stress. As a thickness of a compressive film increases, a negative bowing increases. Likewise, removing such a compressive film at locations reduces negative bowing at those locations.

Backside processing can include multiple steps. For example, a backside surface can be stripped or cleaned as a preliminary step. A metrology step can then be executed that measures bow of a given wafer. This bow measurement can be used for targeted backside processing. One or more tools and/or modules can be used for techniques herein. For example, a single tool can include one or more metrology modules configured to measure wafer bow, and one or more backside depositions modules configured to deposit one or more films on the backside surface based on measured wafer bow, all on a common platform. Alternative embodiments can use separate tools/systems, but may require manual wafer porting between tools. The benefit of a common platform is an increased efficiency.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A system for modifying wafer bow, the system comprising:
    a metrology module included on a common platform configured to measure wafer bow of a substrate and generate an initial wafer bow value that identifies a degree of first order wafer bowing of the substrate, the substrate having a working surface and a backside surface opposite to the working surface, wherein the metrology module comprises a measurement arm including a sensor, and the measurement arm is configured to move when the sensor measures the wafer bow of the substrate;
    a controller configured to receive the initial wafer bow value and identify parameters, based on the initial wafer bow value and a modified wafer bow value, a correction film recipe to change wafer bow of the substrate from an initial wafer bow to the modified wafer bow, the initial wafer bow resulting from one or more micro fabrication processing steps executed on the working surface of the substrate; and
    a backside deposition module included on the common platform having a substrate holder, an automated substrate handling system configured to move the substrate from the metrology module after the initial wafer bow measurement to the backside deposition module, and substrate treatment components configured to deposit a correction film including alternating layers of different materials on the backside surface of the substrate according to the correction film recipe, wherein the parameters of the correction film recipe cause the deposition of the correction film to physically modify the internal stresses on the substrate to have the modified wafer bow having a modified wafer bow value of less than 300 microns in magnitude, and the correction film includes blanket films.

2. The system of claim 1, wherein the correction film recipe identifies a thickness of material to be deposited on the backside surface of the substrate.

3. The system of claim 1, wherein the correction film recipe identifies a type of material to be deposited on the backside surface of the substrate.

4. The system of claim 1, wherein the correction film recipe identifies a deposition temperature of material to be deposited on the backside surface of the substrate.

5. The system of claim 1, wherein the correction film recipe specifies parameters of the correction film to be deposited on the backside surface of the substrate.

6. The system of claim 1, wherein the initial wafer bow value represents a substrate having a convex shape of the working surface, and wherein the modified wafer bow value of the modified wafer bow represents a concave shape of the working surface.

7. The system of claim 1, wherein the correction film recipe identifies a number of atomic layer deposition cycles to execute using the backside deposition module.

8. The system of claim 1, wherein the initial wafer bow has a value less than 100 microns in magnitude.

9. The system of claim 1, wherein the backside deposition module uses chemical vapor deposition and wherein the correction film recipe includes an indication of a type of material, deposition temperature, and a final thickness of the correction film.

10. The system of claim 1, wherein the metrology module measures z-height deviations across the backside surface of the substrate to generate the initial wafer bow value.

11. The system of claim 10, wherein the metrology module measures z-height deviations using acoustic techniques.

12. The system of claim 1, wherein deposition is executed on the backside surface while held with the working surface facing upwards.

13. The system of claim 1, wherein the controller identifies the correction film recipe based on device parameters of the working surface of the substrate in addition to the initial wafer bow value.

14. The system of claim 1, wherein the sensor is configured to measure the wafer bow of the substrate acoustically.

15. A system for modifying wafer bow, the system comprising:
    a metrology module included on a common platform configured to measure wafer bow of a substrate and generate an initial wafer bow value that identifies a degree of first order wafer bowing of the substrate and includes z-height variation mapping, the substrate having a working surface and a backside surface opposite to the working surface, wherein the metrology module comprises a measurement arm including a sensor, and the measurement arm is configured to move when the sensor measures the wafer bow of the substrate;
    a controller configured to receive the initial wafer bow value including the z-height variation mapping and identify parameters, based on the initial wafer bow value and a modified wafer bow value, a correction film recipe to change wafer bow of the substrate from an initial wafer bow to the modified wafer bow, the initial wafer bow resulting from one or more micro fabrication processing steps executed on the working surface of the substrate; and
    a backside deposition module included on the common platform having a substrate holder, an automated substrate handling system configured to move the substrate from the metrology module after the initial wafer bow measurement to the backside deposition module, and substrate treatment components configured to deposit a correction film including alternating layers of different materials on the backside surface of the substrate according to the correction film recipe, wherein the correction film includes blanket films.

16. The system of claim 15, wherein the parameters of the correction film recipe cause the deposition of the correction film to physically modify the internal stresses on the substrate to have the modified wafer bow having a modified wafer bow value of less than 300 microns in magnitude.

17. The system of claim 15, wherein the correction film recipe identifies at least one selected from the group consisting of a thickness of material to be deposited on the backside surface of the substrate, a type of material to be deposited on the backside surface of the substrate and a deposition temperature of material to be deposited on the backside surface of the substrate.

18. The system of claim 15, wherein the correction film recipe specifies parameters of the correction film to be deposited on the backside surface of the substrate.

19. The system of claim 15, wherein the backside deposition module uses chemical vapor deposition, and the correction film recipe includes an indication of a type of material, deposition temperature, and a final thickness of the correction film.

20. The system of claim 15, wherein the metrology module measures z-height deviations across the backside surface of the substrate to generate the initial wafer bow value.

* * * * *